United States Patent [19]

Tomioka et al.

[11] Patent Number: 5,441,014

[45] Date of Patent: * Aug. 15, 1995

[54] APPARATUS FOR PULLING UP A SINGLE CRYSTAL

[75] Inventors: Junsuke Tomioka, Hiratsuka; Kazunori Nagai, Miyazaki; Akihiro Matsuzaki, Hiratsuka, all of Japan

[73] Assignee: Komatsu Electronic Metals Co., Ltd., Kanagawa, Japan

[*] Notice: The portion of the term of this patent subsequent to May 31, 2011 has been disclaimed.

[21] Appl. No.: 170,175

[22] PCT Filed: Jun. 24, 1991

[86] PCT No.: PCT/JP91/00849

§ 371 Date: Dec. 22, 1993

§ 102(e) Date: Dec. 22, 1993

[87] PCT Pub. No.: WO93/00462

PCT Pub. Date: Dec. 22, 1993

[51] Int. Cl.$^6$ .............................. C30B 35/00
[52] U.S. Cl. ...................... 117/213; 117/31; 117/208
[58] Field of Search ............... 117/31, 200, 208, 213, 117/217

[56] References Cited

U.S. PATENT DOCUMENTS

3,694,165  9/1972  Kramer ................. 117/217
4,956,153  9/1990  Yamashita et al. ........ 117/217
4,981,549  1/1991  Yamashita et al. ........ 117/217
5,264,189 11/1993  Yamashita et al. ........ 117/217
5,316,742  5/1994  Tomioka et al. ......... 117/217

Primary Examiner—R. Bruce Breneman
Assistant Examiner—Felisa Garrett
Attorney, Agent, or Firm—Larson and Taylor

[57] ABSTRACT

An apparatus for pulling up a single crystal according to Czochralski method is provided with a cylindrical first screen and a second screen. The first screen is arranged in the periphery of the zone of pulling up the single crystal, said screen being constituted by a heat absorbing body at the side facing a quartz crucible and by a heat insulator at the other side and being provided with respective outward and inward annular rims at the upper and lower ends thereof, the corner of said screen facing the crucible being formed in a curved or polygonal structure, and said annular rim at the lower end being positioned in the vicinity of filling the melt in the crucible. The second screen forming a parabolic shape in the section opening at its center while enclosing the crystal pulling-up zone and being provided at its upper end with an outward annular rim. Alternately, the second screen formed along the first screen may be provided within said first screen, and further the second screen may be provided with a forced cooling mechanism.

4 Claims, 5 Drawing Sheets

APPARATUS FOR PULLING UP A SINGLE CRYSTAL

INDUSTRIAL FIELD OF THE INVENTION

This invention relates to an apparatus for pulling up a single crystal according to Czochralski method, and more particularly to an apparatus for pulling up a single crystal, which is provided with screens which can float up a single crystal at a high speed while controlling contamination of the crystal, which is caused by impurities, and without impeding the single crystallization.

PRIOR ART

As known apparatus for pulling up a single crystal, in which the pulling-up speed of the crystal is improved, there are some patent applications. Japanese Patent Kokai No. 62-138386 discloses a technique of speeding up the floating rate while controlling contamination of the crystal, by shielding the radiant heat generated from the melt with the provision of a radiant screen of an approximately inverted cone-shaped, heat-insulating multilayer structure thereby to prevent the pulling-up single Crystal from heating, said multilayer structure being provided close to the surface of the melt and its surface being sintered with a ceramic body or ceramic-coated.

Alternately, Japanese Patent Kokai No. 63-256593 discloses a technique of aiming at a further effect for speeding up the pulling by providing a shielding member of upturned trapezoid shape in section, which member surrounds the pulling-up zone of the single crystal, and a cooling mechanism.

Alternately, as a technique of improving the pulling-up rate of the single crystal and the non-transition of the crystal, which is caused by contamination of impurities, Japanese Patent Kokai No. 63-50391 discloses the one wherein a cylinder is provided in the periphery of a growing single crystal, said cylinder having a cooling mechanism in its periphery, the inner peripheral surface of the cylinder forming a reflection surface of radiant heat, and the surface said cylinder opposing the melt material forming a reflection surface of the radiant heat. Further, as a technique of removing contamination caused by impurities Japanese Patent Kokai No. 64-18988 describes the one of disposing a plurality of heat shielding plates made concentrically of metal or graphite, in the periphery of the pulled-up single crystal, in such a way that they may communicate with the outside without enclosing the crucible while keeping spaces mutually. Furthermore, as a technique of improving the pulling-up rate of the single crystal and the non-trasition caused by contamination of impurities, Patent Kokai No. 1-145391 describes the one of providing, in a cooling means arranged at the circumference of the pulled-up single crystal, a shielding element made of molybdenum to shield the space between said cooling means and the crucible or the melt in the crucible.

However, such known techniques have the following disadvantages.

(1) To speed up the pulling rate of a growing crystal it is important to have the transmitted heat from the melt, the latent heat for solidification in the crystallization process, the radiant heat emitted from heat source such as the melt or heater, and the like, escapted quickly from the growing crystal. Particularly, it is possible to speed up the pulling-up ate if the temperature gradient near the interface of the solid solution is great, even if the consequentinal temperature gradient in the growing crystal were small i.e. the cooling rate were a little bit slow.

However, in the techniques such as inverted cone-shaped screen, which are disclosed in the conventional apparatus, the view angle to the growing crystal is sufficiently small particularly in the neighborhood of the solid solution interface, so that the radiant heat or the like generated from the neighborhood of said Alternately, Japanese Patent Kokai No. 63-256593 discloses a technique of aiming at a further effect for speeding up the pulling by providing a shielding member of upturned trapezoid shape in section, which member surrounds the pulling-up zone of the single crystal, and a cooling mechanism.

Alternately, as a technique of improving the pulling-up rate of the single crystal and the non-transition of the crystal, which is caused by contamination of impurities, Japanese Patent Kokai No. 63-50391 discloses the one wherein a cylinder is provided in the periphery of a growing single crystal, said cylinder having a cooling mechanism in its periphery, the inner peripheral surface of the cylinder forming a reflection surface of radiant heat, and the surface said cylinder opposing the melt material forming a reflection surface of the radiant heat. Further, as a technique of removing contamination caused by impurities Japanese Patent Kokai No. 64-18988 describes the one of disposing a plurality of heat shielding plates made concentrically of metal or graphite, in the periphery of the pulled-up single crystal, in such a way that they may communicate with the outside without enclosing the crucible while keeping spaces mutually. Furthermore, as a technique of improving the pulling-up rate of the single crystal and the non-trasition caused by contamination of impurities, Patent Kokai No. 1-145391 describes the one of providing, in a cooling means arranged at the circumference of the pulled-up single crystal, a shielding element made of molybdenum to shield the space between said cooling means and the crucible or the melt in the crucible.

However, such known techniques have the following disadvantages.

(1) To speed up the pulling rate of a growing crystal it is important to have the transmitted heat from the melt, the latent heat for solidification in the crystallization process, the radiant heat emitted from heat source such as the melt or heater, and the like, escapted quickly from the growing crystal. Particularly, it is possible to speed up the pulling-up rate if the temperature gradient near the interface of the solid solution is great, even if the consequentinal temperature gradient in the growing crystal were small i.e. the cooling rate were a little bit slow.

However, in the techniques such as inverted cone-shaped screen, which are disclosed in the conventional apparatus, the view angle to the growing crystal is sufficiently small particularly in the neighborhood of the solid solution interface, so that the radiant heat or the like generated from the neighborhood of said inverted trapezoid or cone and the corner of the screen is not smooth, the Ar gas accompanied by impurities is apt to stay in the vicinity of the interface between the crucible and the melt whereby the melt is contaminated to hinder the single cristallization of the growing crystal.

(6) If a heavy metal is used for the reflection surface of radiant heat, which is provided in the lower portion of the cooling cylinder, though said surface is constituted by metallic foil or a material having a metallic layer, the heavy metal contaminates the melt when a single crystal such as silicon is pulled up thereby resulting in contamination of the single crystal itself. Then, the electric property of the device made of such single crystal is adversely affected.

(7) SiO, SiO$_2$ and Si to be the substances evaporated from the melt precipitate for harmonization upon the heat insulator in the external face of the cooling cylinder, when they fall into the melt to contaminate the crystal and obstruct the single cristallization. On the other hand, use of fibrous graphite as a heat insulator will deteriorate the insulator itself being exposed to the substances evaporated from the melt whereby the insulator is released to hinder the single crystallization in some occasions.

(8) If metal such as molybdenum or graphite and a plurality of heat insulating plates are provided keeping spaces mutually, concentrically in the circumference of the pulled-up single crystal, a fresh, clean argon gas is hardly introduced into the crucible. That is, the argon annular rim.

An alternative structure may be such that in an apparatus for pulling a single crystal according to Czochralski method, a cylindrical first screen is arranged in the periphery of the zone of pulling the single crystal, 10 said screen being constituted by a heat absorbing body at the side facing a quartz crucible and by a heat insulator at the other side and being provided with respective outward and inward annular rims at the upper and lower ends thereof, the corner of said screen facing the crucible being formed in a curved or polygonal structure, and said annular rim at the lower end being positioned in the vicinity of filling the melt in the crucible, and then a second screen is arranged within said first screen, said second screen being formed along the first screen in its sectional shape.

It is further possible to provide a forced cooling mechanism in said second screen.

BRIEF DESCRIPTION OF THE DRAWINGS

FIG. 1 shows an apparatus for pulling up a single crystal, illustrating an Example of the invention; FIG. 2 shows an apparatus for pulling up a single crystal, illustrating another Example of the invention;

FIG. 3 shows an apparatus for floating up a single crystal, illustrating still another Example of the invention; and molybdenum is exposed to the substances evaporated from the melt. On the other hand, the substances evaporated from the melt precipitate for solidification in the cooling cylinder or chamber being cooled with water, and they fall into the melt to often obstruct the single crystallization.

SUMMARY OF THE INVENTION

The present invention has been made to eliminate the above disadvantages of said known apparatus. In an apparatus for pulling up a single crystal according to Czochralski method the invention is characterized such that a cylindrical first screen is arranged in the periphery of the zone of pulling up a single crystal, said screen being constituted by a heat absorbing body at the side facing a quartz crucible and by a heat insulator at the other side and being provided with respective outward and inward annular rims at the upper and lower ends thereof, the corner of said screen facing the crucible being formed in a curved or polygonal structure, and said annular rim at the lower end being positioned in the vicinity of filling the melt in the crucible, and then a second screen is arranged within said first screen, said second screen forming a parabolic shape in section opening at its center while enclosing the crystal pulling zone and being provided at its upper end with an outward inverted trapezoid or cone and the corner of the screen is not smooth, the Ar gas accompanied by impurities is apt to stay in the vicinity of the interface between the crucible and the melt whereby the melt is contaminated to hinder the single cristallization of the growing crystal.

(6) If a heavy metal is used for the reflection surface of radiant heat, which is provided in the lower portion of the cooling cylinder, though said surface is constituted by metallic foil or a material having a metallic layer, the heavy metal contaminates the melt when a single crystal such as silicon is pulled up thereby resulting in contamination of the single crystal itself. Then, the electric property of the device made of such single crystal is adversely affected.

(7) SiO, SiO$_2$ and Si to be the substances evaporated from the melt precipitate for harmonization upon the heat insulator in the external face of the cooling cylinder, when they fall into the melt to contaminate the crystal and obstruct the single cristallization. On the other hand, use of fibrous graphite as a heat insulator will deteriorate the insulator itself being exposed to the substances evaporated from the melt whereby the insulator is released to hinder the single crystallization in some occasions.

(8) If metal such as molybdenum or graphite and a plurality of heat insulating plates are provided keeping spaces mutually, concentrically in the circumference of the pulled-up single crystal, a fresh, clean argon gas is hardly introduced into the crucible. That is, the argon gas led from the upper portion of the chamber does not flow in the crucible, and instead it flows directly between the crucible and the heater and between the heater and the heat insulating cylinder in its outside so as to be exhausted. Thus, the substances evaporated from the melt stay in the crucible, and this often obstructs the single crystallization.

(9) The heat insulating plates themselves are plate-like and the heat-retaining effect by the heat insulating material or the like is low, and therefore, even if a plurality of heat insulating plates are provided keeping spaces mutually, it results that there are created some portions where the temperature is lowered below 800° C. The substances evaporated from the melt precipitate for solidification in said portions, and the precipitation substances fall down to often hinder the single crystallization.

(10) Even if a plurality of heat insulating plates are provided in the periphery of the pulled-up crystall while keeping spaces mutually, the heat emitted from the crystal is retained if the plates are provided too close to the crystal. This results in lowering the pulled-up rate.

(11) Provision of a molybdenum-made shield in the vicinity of the melt will contaminate the melt by the metal, and molybdenum is exposed to the substances evaporated from the melt. On the other hand, the substances evaporated from the melt precipitate for solidification in the cooling cylinder or chamber being cooled with water, and they fall into the melt to often obstruct the single crystallization.

SUMMARY OF THE INVENTION

The present invention has been made to eliminate the above disadvantages of said known apparatus. In an apparatus for pulling up a single crystal according to Czochralski method the invention is characterized such that a cylindrical first screen is arranged in the periphery of the zone of pulling up a single crystal, said screen being constituted by a heat absorbing body at the side facing a quartz crucible and by a heat insulator at the other side and being provided with respective outward and inward annular rims at the upper and lower ends thereof, the corner of said screen facing the crucible being formed in a curved or polygonal structure, and said annular rim at the lower end being positioned in the vicinity of filling the melt in the crucible, and then a second screen is arranged within said first screen, said second screen forming a parabolic shape in section opening at its center while enclosing the crystal pulling zone and being provided at its upper end with an outward annular rim.

An alternative structure may be such that in an apparatus for pulling a single crystal according to Czochralski method, a cylindrical first screen is arranged in the periphery of the zone of pulling the single crystal, said screen being constituted by a heat absorbing body at the side facing a quartz crucible and by a heat insulator at the other side and being provided with respective outward and inward annular rims at the upper and lower ends thereof, the corner of said screen facing the crucible being formed in a curved or polygonal structure, and said annular rim at the lower end being positioned in the vicinity of filling the melt in the crucible, and then a second screen is arranged within said first screen, said second screen being formed along the first screen in its sectional shape.

It is further possible to provide a forced cooling mechanism in said second screen.

THE BEST MODE FOR CARRYING OUT THE INVENTION

[FUNCTION]

A cylindrical first screen provided with annular rims is disposed closer to heating elements such heater, melt and crucible wall, compared with the screen of conventional apparatus thereby to shield the radiant heat in the places near the heat sources. By coating the side facing the quartz crucible with SiC or $Si_3N_4$ excellent in heat absorbing property said face of the first screen is retained at a high temperature to prevent the screen from adhesion of the substances evaporated from the silicon melt. The first screen is provided in such a manner that the annular rims may be in parallel with the surface of the melt while the cylindrical portion may be in parallel with the wall of the crucible, and the corner at the side facing the crucible is formed in a curved or polygonal face, and therefore, the substances evaporated from the silicon melt is smoothly discharged to the outside of the crucible withouting staying there.

In a second screen having a parabolic shape in section, the radiant heat having absorbing property or that emitted from the vicinity of the interface of the view solution reflects upwardly due to the effect of solid angle, and the radiant heat emitted from the growing crystal portion further above the solid solution interface reflects likewise upwardly.

In the structure where the second screen is formed along the first screen, heat insulation is intended near the heat source such as crucible, heater or melt.

Provision of a forced cooling mechanism such as by water cooling in the second screen will allow the radiant heat generated from the growing crystal to be easily absorbed whereby the heat escapes outside the system to cool the growing crystal.

The invention will now be described more in detail by way of Examples.

[EXAMPLE]

Figure 1:
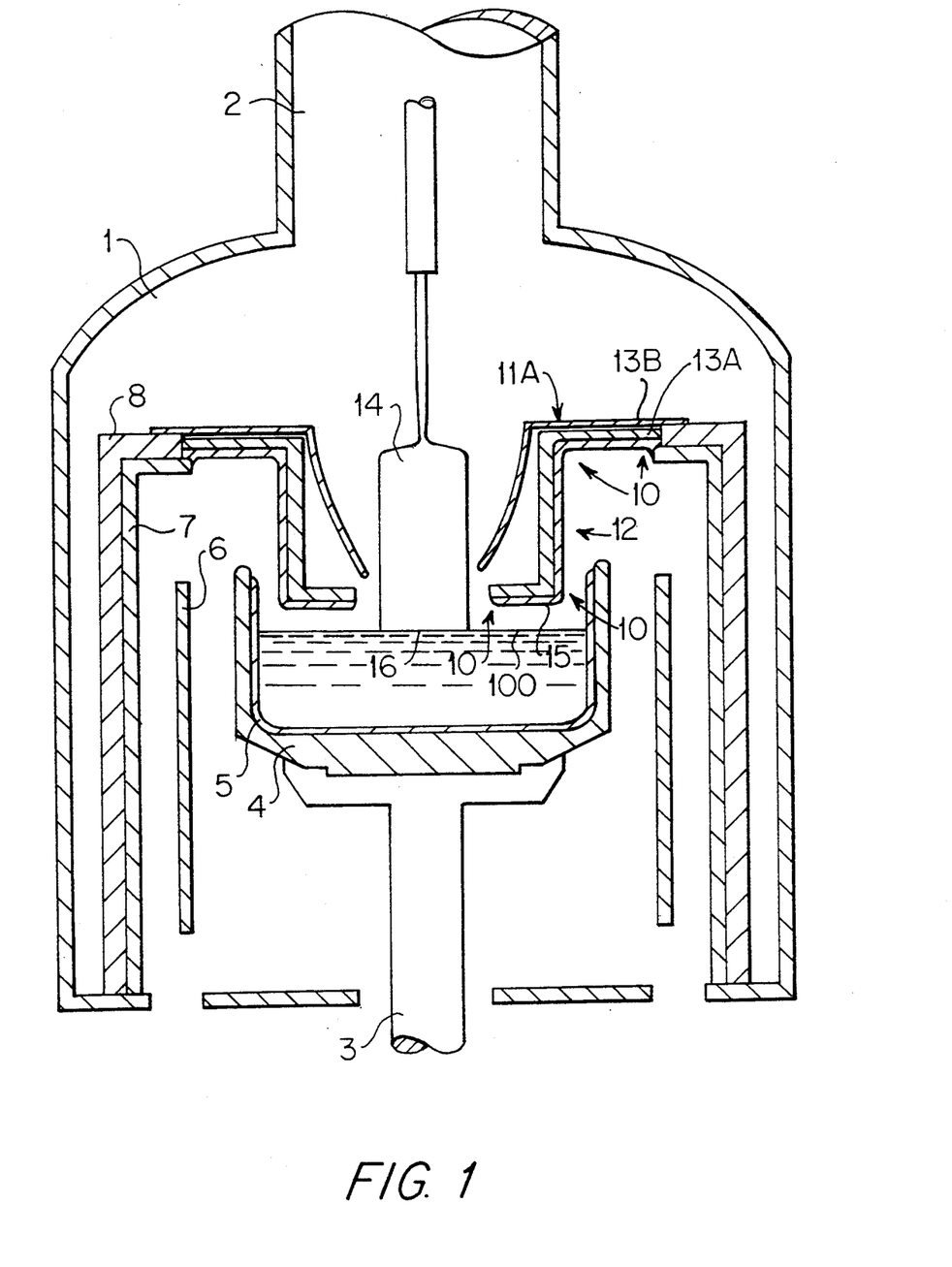
FIG. 1 shows an apparatus for pulling up a single crystal, illustrating an Example of the invention.

FIG. 1 shows one Example of the apparatus for pulling up a single crystal according to the invention. A pull chamber 2 is provided in the upper portion of a chamber 1. A vertically movable, rotary shaft 3 is inserted from the lower, central opening of the chamber 1, and a supporter 4 made of carbon is fixed to the upper end of the rotary shaft 3 to support a quartz crucible 5. The outer periphery of said supporter 4 is provided with a carbon heat-insulating member 7 for shielding the radiation which is trasmitted from a cylindrical carbon heater 6 to the chamber 1, and with a heat insulating cylinder 8 for shielding said member 7, said cylinder 8 being made of carbon felt.

A cylindrical first screen 12 is fixed to the upper end of said heat insulating cylinder 8, in the flange portion of an annular rim 13A provided outwardly in the upper end of the screen, it descends along the wall of the quartz crucible 5, and its lower end reaches the vicinity of the surface 100 of the melt. The lower end of said first screen is provided with an annular rim 15, covering the melt surface 100 toward the inside of the chamber 1 and extending to the neighborhood of a growing crystal 14, and a corner 10 is formed with a curved face. On the other hand, the flanges of the crucible 5 and the supporter 4 are respectively round-shaped.

The side facing the crucible 5 of the first screen 12 uses carbon coated with SiC as a heat absorber having a great radiation rate (0.8-0.5). Since the first screen 12 is subject to the radiation generated from the melt surface 100, the wall of the quartz crucible 5, and the heater 6, and the first creen itself gets a high temperature, so that adhesion of SiO, $SiO_2$ and Si generated from the melt surface 100 does not occur in the screen. Furthermore, since the first screen is cylindrical and provided near the heat sources it efficiently shields the radiant heat emitted from said heat sources. Then, since the corner 10 at the side oppositely facing the wall of the crucible or the melt surface is formed in a curved face, the substances evaporated in the crucible are smoothly discharged without staying near the interface between the crucible and the melt surface or at the corner of the first screen whereby the single crystallization is not hindered.

Furthermore, the growing crystal side of the first screen 12 is provided with a heat insulator made of carbon felt, so that the growing crystal is effectively heat insulated from the great heat sources such as the melt surface 100, the wall of the crucible 5 and the heater 6.

A second screen 11A is of parabolic shape in section and made of carbon, and it is fixed to the upper end of the heat insulating cylinder 8 like the first screen, by means of an annular rim 13B provided outwardly in its upper end.

Referring to the temperature distribution in the growing crystal 14, the temperature is lowered almost in exponential function from the interface 16 of the solid solution toward the top side. On the other hand, the crystal growing rate greatly depends on the temperature gradient in the crystal near the growing interface. Therefore, in order that the radiation from the surface of the growing crystal in the vicinity of the solid solution interface be efficiently reflected or absorbed upwardly for escape there is adopted a screen of parabolic profile in section where the solid angle to the crystal surface near the growing interface is smaller than that in the screen of upturned-cone shape. This will increase the temperature gradient in the vicinity of the growing interface.

Alternately, since the surface of the screen is substituted always by a fresh inert gas the screen is not exposed to SiO, SiO₂ and Si to be the substances evaporated from the melt even if the temperature is low, so that the impurities do not fall upon the growing crystal.

By using the present apparatus, 30 kg of polycrystal silicon was put into a quartz crucible of about φ340 mm wide and 250 mm deep to pull up a single crystal having about 100 100 mm diameter according to an ordinary method, when it was possible to obtain a single crystal of about 1,250 mm long at a high rate in the range 1.9 to 2.0 mm/min. and with good reproducibility, and the single crystallization was not hindered.

Even the drawbacks for crystal could be eliminated and the oxygen concentration could be lowered. This results in speeding up the pulling rate and saving energy.

Figure 5:
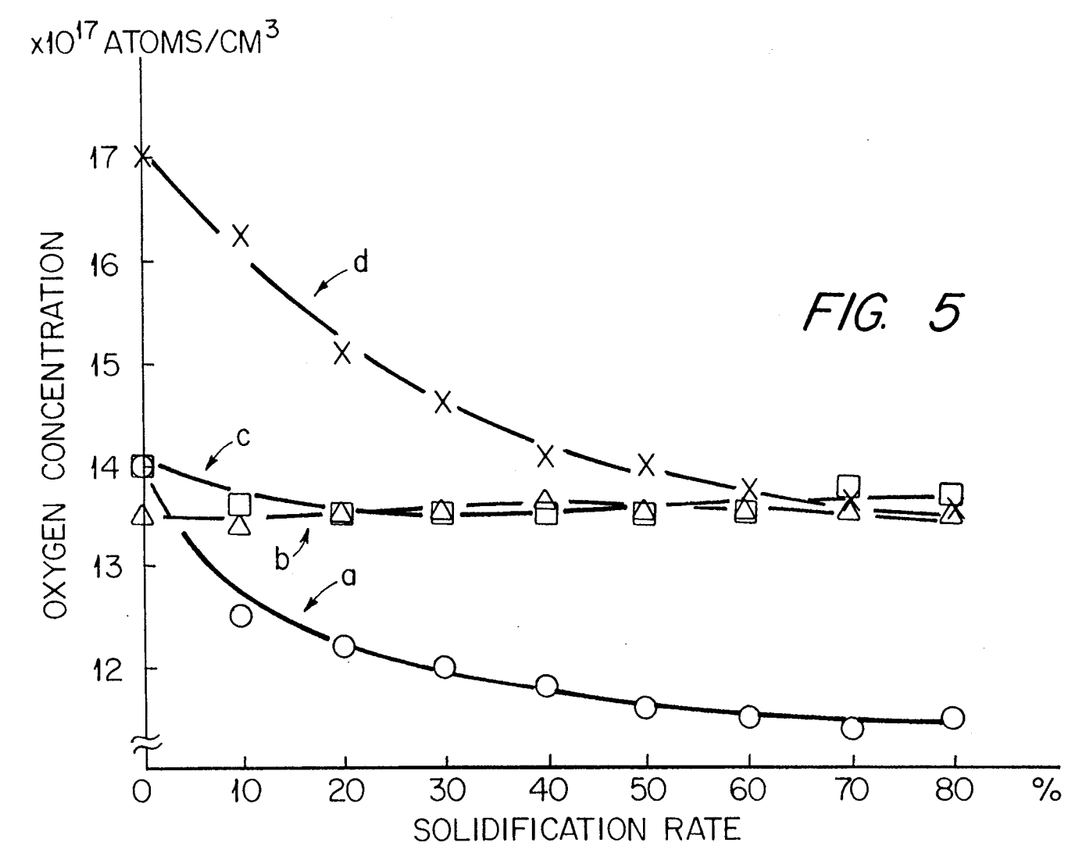
FIG. 5 is a graph showing oxygen concentration to the solidification rates of the single crystals of silicon, which are pulled up by the present apparatus and known apparatus.

The property of the single silicon crystal pulled (or grew) up by this Example is shown with curve a in FIG. 5.

Alternately, even use of metal such as molybdenum in the second screen will not bring about any problem.

8 EXAMPLE 2]

Then, the invention will be described with reference to another Example illustrated in FIG. 2.

In explaining Example 2 the reference numerals same as in Example 1 are used to indicate the constitutional elements same as those of Example 1, and any overlapping description is omitted.

Figure 2:
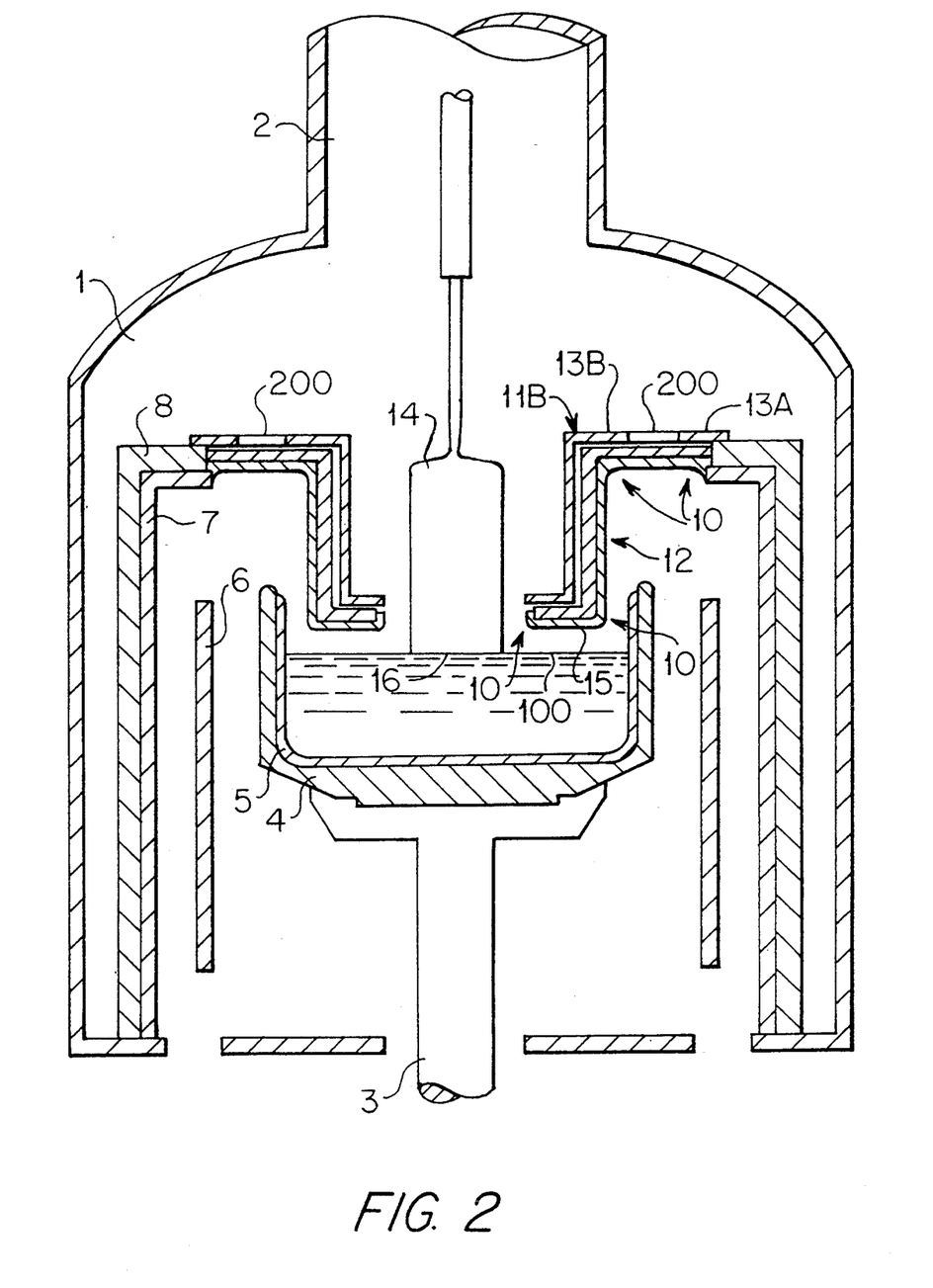
FIG. 2 shows an apparatus for pulling up a single crystal, illustrating another Example of the invention.

In the Example of FIG. 2, the major point different from Example 1 is that the second screen 11B adopted is not of parabolic shape in section but of shape formed along the first screen 12. Such shape avoids the radiant heat to the growing crystal in the neighborhood to the heat sources of the heater 6, the crucible 5 and the melt to permit the heat insulating effect to be improved.

Additionally, in this second Example, a ventilation hole 200 for leading an inert gas to the space between the first screen and the Second screen is provided in the upper annular rim 13B of the second screen. This aims at passing the fresh inert gas through the space between the screens thereby preventing adhesion of the substances evaporated from the melt surface.

By using the present apparatus, 30 Kg of polycrystal silicon was put into a quartz crucible of about φ340 mm wide and 250 mm deep to pull up a single crystal having about φ110 mm diameter under an ordinary method, when it 10 was possible to obtain a single crystal of 1,250 mm long at the high pulling rate of 1.9 to 2.0 mm/min. and with good reproducibility, and the single crystallization was not checked. Additionally, even the drawbacks for crystal could be eliminated and the oxygen concentration could be lowered thereby resulting in improving the speeding up of the pulling rate and saving energy.

The property of the single silicon crystal pulled (or grew) up in Example 2 is shown with curve in FIG. 5.

[EXAMPLE 3]

Figure 3:
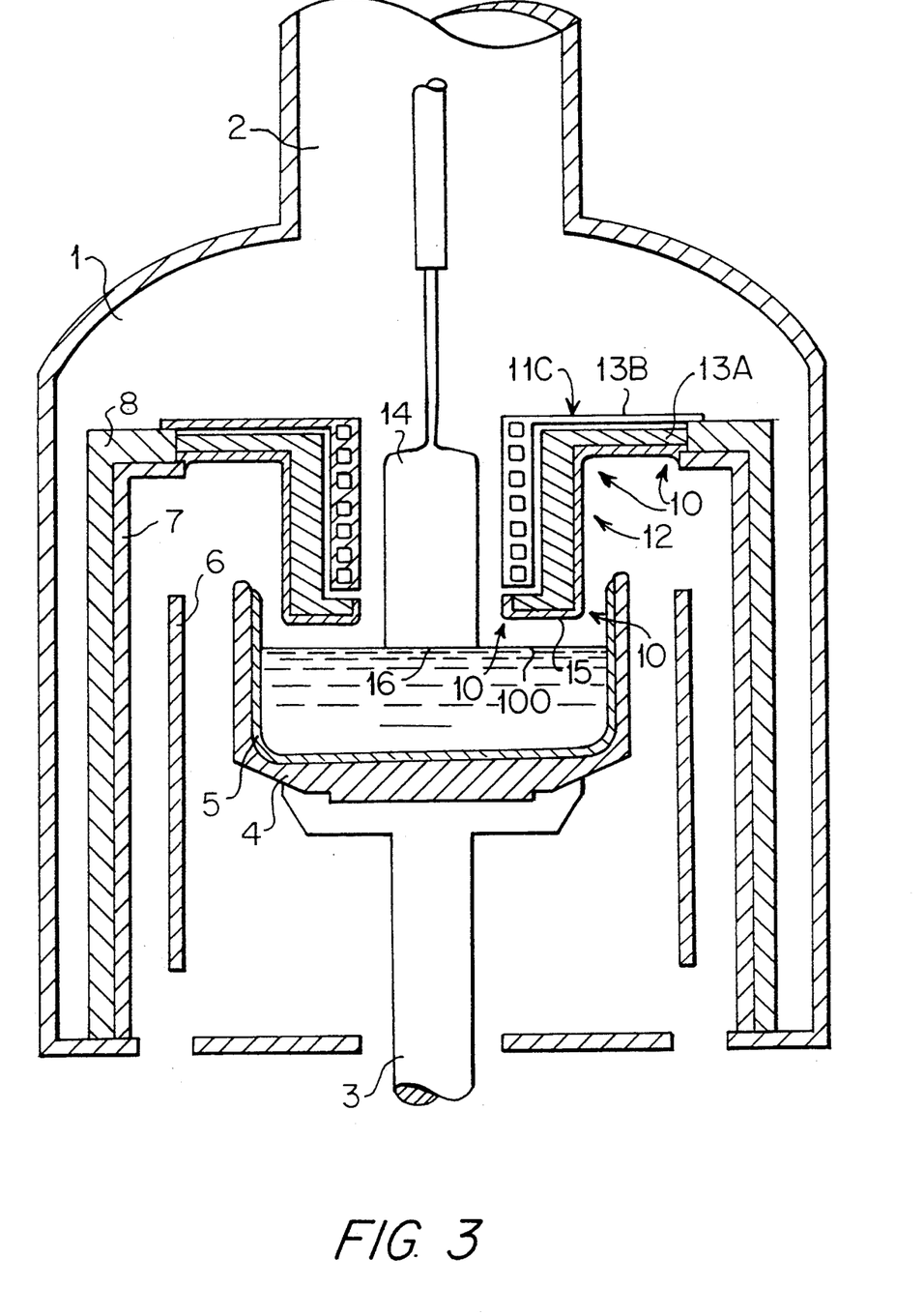
FIG. 3 shows an apparatus for floating up a single crystal, illustrating still another Example of the invention.

The invention will be described with reference to still another Example illustrated in FIG. 3.

Similarly to Example 2, in explaining Example 3 the reference numerals same as in Example 1 are used to indicate the constitutional elements same as those of Example 1, and any overlapping description is omitted.

A second screen 11C having excellent heat absorbing property (large emissivity) and made of carbon is provided in a sectional inverted L-shape, and the inside thereof is constructed in a jacket so that it is passed with-a cooling gas to cool the screen. Thus, the provision of the second screen is to cool the screen itself, then thereby to subject the growing crystal to a forced cooling and to improve the growing rate of the single crystal.

By using the present apparatus, 30 Kg of polycrystal silicon was put into a quartz crucible of about φ340 mm wide and 250 mm deep to pull up a single crystal having about φ110 mm diameter according to an ordinary method, when it was capable of obtaining a single crystal of about 1,250 mm long at the high pulling rate of 2.5 to 2.6 mm/min. and with good reproducibility. The single crystallization was not checked. Additionally, it was possible to eliminate even the drawbacks of crystal, to lower the oxygen concentration and to save energy because of the speeding up of the pulling rate.

The property of the single silicon crystal pulled (or grew) up according to Example 3 is illustrated with curve c in FIG. 5.

Figure 4:
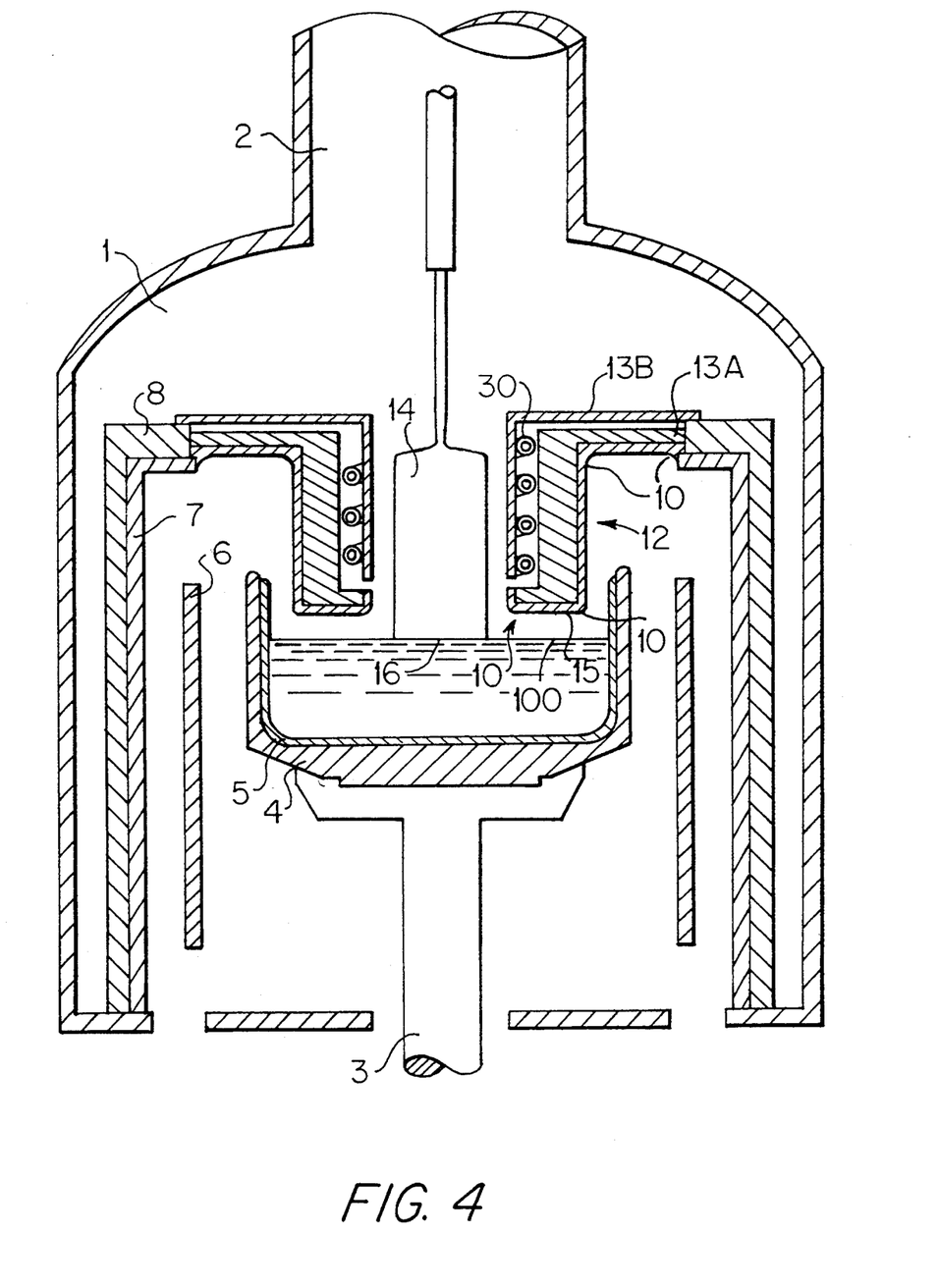
FIG. 4 shows an apparatus for pulling up a single crystal, illustrating another Example of the invention.

The forced cooling mechanism of the second screen is constructed in such a manner that as shown in FIG. 4, pipes 30 are provided in the outer periphery of the second screen having a large emissivity and an upturned L-shape in section, to allow the pipes to be passed with water or cooling gas.

By comparison, the property of the single silicon crystal pulled (or grew) up by using a conventional apparatus under the same conditions as in said Examples, is shown with curve d in FIG. 5.

In each of said Examples, the first screen and 10 the second screen are disposed keeping a small space. Due to such a space it is capable of avoiding heat transmission from the first screen to the second screen so as to effectively shield the radiant heat emitted from the heat sources to the growing crystal. Provision of a hole in the upper portion of the second screen will feed a fresh argon gas into the space between the first and second screens. Thus, since the space between the two screens is maintained always clean the surfaces of the screens are not exposed to SiO, $SiO_2$ and Si to be the substances evaporated from the melt even if the surfaces are low in temperature, and therefore since the crystal is not adhered with such precipitated substances the single crystallization is not hindered.

As described above in detail, according to the present invention, one side of the first screen, which faces the crucible, is constituted by a heat absorbing body whereas the other side thereof is constituted by a heat insulating body, so that the side facing the crucible gets high temperature by the heat generated from the heat source such as the crucible or heater thereby to prevent precipitation and adhesion of evaporation substances. And the heat insulating body at the other side makes the heat from the heat source hardly transmittable to the second screen or the growing crystal side. Moreover, since the first screen is formed to be along the crucible and the melt surface while its corner is curved, gas, including evaporation substances, does not stay but is smoothly exhausted.

On the other hand, the second screen whose section forms a parabola opening in its center while enclosing the pulling-up zone of the single crystal, let the radiant heat from the growing crystal escape upwardly owing to the effect of view angle with the intention of cooling the growing crystal.

These functions and effects increase the temperature gradient of the solid solution interface of the growing crystal whereby the pulling-up speed is improved.

Alternately, in an apparatus where the second screen is formed along the first screen in profile, the apparatus has no effect of radiation of the radiant heat, which effect is brought about by view angle, but the cooling effect of the single crystal is likewise brought about because the heat shielding is effected close to the heat source such as the heater. Furthermore, provision of a cooling mechanism in the second screen will improve the cooling effect.

In the apparatus illustrated in any of said Examples of the invention, the annular rims shield some heat that transmits upwards from the heater, the crucible 10 or the melt so as not to extend to the pulling-up region of the growing crystal.

Thus, in the apparatus for Pulling up a single crystal according to the present invention, it is possible to speed up the pulling rate of the growing crystal and to reduce the factors of hindering the single crystallization thereby improving the productivity.

Additionally, use of molybdenum, tantalum and tungsten will not cause any trouble since they are in a clean argon gas.

INDUSTRIALLY POSSIBLE USE OF THE INVENTION

This invention is used for an apparatus for pulling up a single crystal according to Czochralski method.

We claim:

1. An apparatus having a zone for pulling up a single crystal, which comprising a quartz crucible for containing a material, a heater which is provided in the periphery of said crucible for melting a material in the crucible, and a mechanism for immersing a seed crystal into molten material in the crucible to pull up a single crystal, said apparatus having a cylindrical first screen arranged in the periphery of the zone of pulling up a single crystal, said screen comprising a heat absorbing body at the side facing the crucible and a heat insulator at the other side and being provided with respective outward and inward annular rims at the upper and lower ends thereof, the corner of said first screen facing the crucible being formed in a curved or polygonal structure, and said annular rim at the lower end of said first screen being positioned in the vicinity of a surface of molten material in the crucible, and a second screen arranged within said first screen, said second screen forming a parabolic shape in section opening at its center while enclosing the crystal pulling-up zone and being provided at its upper end with an outward annular rim.

2. An apparatus as set forth in claim 1 wherein the second screen is equipped with a forced cooling mechanism.

3. An apparatus having a zone for pulling up a single crystal, which comprises a quartz crucible for containing a material, a heater which is provided in the periphery of said crucible for melting a material in the crucible, and a mechanism for immersing a seed crystal into a molten material in the crucible to pull up a single crystal, said apparatus having a cylindrical first screen arranged in the periphery of the zone of pulling up a single crystal, said screen comprising a heat absorbing body at the side facing the crucible and a heat insulator at the other side and being provided with respective outward and inward annular rims at the upper and lower ends thereof, the corner of said first screen facing the crucible being formed in a curved or polygonal structure, and said annular rim at the lower end of said first screen being positioned in the vicinity of a surface of molten material in the crucible, and a second screen arranged within said first screen, said second screen being formed along the first screen in its sectional shape.

4. An apparatus as set forth in claim 3 wherein the second screen is equipped with a forced cooling mechanism.

* * * * *